US009323164B2

(12) United States Patent
Dziomkina

(10) Patent No.: US 9,323,164 B2
(45) Date of Patent: *Apr. 26, 2016

(54) COATINGS

(71) Applicant: ASML NETHERLANDS B.V., Veldhoven (NL)

(72) Inventor: Nina Vladimirovna Dziomkina, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/514,019

(22) Filed: Oct. 14, 2014

(65) Prior Publication Data

US 2015/0037595 A1 Feb. 5, 2015

Related U.S. Application Data

(63) Continuation of application No. 12/367,000, filed on Feb. 6, 2009, now Pat. No. 8,889,042.

(60) Provisional application No. 61/028,787, filed on Feb. 14, 2008, provisional application No. 61/193,203, filed on Nov. 5, 2008.

(51) Int. Cl.
G03F 7/20 (2006.01)

(52) U.S. Cl.
CPC .......... G03F 7/7095 (2013.01); G03F 7/70341 (2013.01); G03F 7/70958 (2013.01)

(58) Field of Classification Search
CPC .. G03F 7/2043; G03F 7/2041; G03F 7/70341
USPC ................................................ 252/588, 589
See application file for complete search history.

(56) References Cited

U.S. PATENT DOCUMENTS

| 4,780,103 | A | * | 10/1988 | Minowa .......................... 8/509 |
| 5,563,105 | A | | 10/1996 | Dobuzinsky et al. |
| 6,518,646 | B1 | | 2/2003 | Hopper et al. |
| 7,110,081 | B2 | | 9/2006 | Hoogendam et al. |
| 7,157,145 | B2 | | 1/2007 | Vissing et al. |
| 7,659,039 | B2 | | 2/2010 | Ito et al. |
| 8,889,042 | B2 | * | 11/2014 | Dziomkina ......... G03F 7/70341 252/588 |
| 2004/0126671 | A1 | | 7/2004 | Smith et al. |
| 2004/0136494 | A1 | | 7/2004 | Lof et al. |
| 2004/0207824 | A1 | | 10/2004 | Lof et al. |
| 2005/0175776 | A1 | | 8/2005 | Streefkerk et al. |
| 2006/0038968 | A1 | | 2/2006 | Kemper et al. |
| 2006/0158627 | A1 | | 7/2006 | Kemper et al. |
| 2007/0087271 | A1 | | 4/2007 | Lai |
| 2007/0177125 | A1 | | 8/2007 | Shibazaki |
| 2007/0216881 | A1 | | 9/2007 | Van Der Schoot et al. |
| 2007/0258072 | A1 | | 11/2007 | Nagasaka et al. |
| 2007/0269294 | A1 | | 11/2007 | Nagasaka et al. |
| 2008/0165330 | A1 | | 7/2008 | Mizutani |
| 2008/0199977 | A1 | | 8/2008 | Weigel et al. |
| 2009/0035586 | A1 | * | 2/2009 | Cangemi et al. .............. 428/446 |
| 2009/0059192 | A1 | | 3/2009 | Beckers et al. |
| 2009/0279058 | A1 | | 11/2009 | Hasegawa |
| 2010/0176304 | A1 | | 7/2010 | Sogard |

FOREIGN PATENT DOCUMENTS

| EP | 1 420 300 | 5/2004 | |
| JP | 62-239101 | * 10/1987 | .............. G02B 1/04 |
| JP | 9-324139 | 12/1997 | |
| JP | 2003-330264 | 11/2003 | |
| JP | 2005-101558 | 4/2005 | |
| JP | 2007-017961 | 1/2007 | |
| JP | 2007-201384 | 8/2007 | |
| WO | 99/49504 | 9/1999 | |
| WO | 2006/030908 | 3/2006 | |
| WO | 2006/077859 | 7/2006 | |

OTHER PUBLICATIONS

Hegemann, Dirk et al. "Plasma Treatment of Polymers to Generate Stable, Hydrophobic Surfaces." Plasmas and Polymers. vol. 6, No. 4 (2001): 221-235.
Trojan, K. et al. "Network Modification of DLC Coatings to Adjust a Defined Surface Energy." Phys. Stat. Sol. 145 (1994): 575-585.
Muller, U. et al. "Temperature Stability of Fluorinated Amorphous Hydrogenated Carbon Films." Surface and Coatings Technology 76-77 (1995): 367-371.
Chen, Liang-Yih et al. "Diamond-like Carbon Nanocomposite Films." Applied Physics Letters. vol. 82, No. 20 (2003): 3526-3528.
Nguyen, S.V. "High-density Plasma Chemical Vapor Deposition of Silicon-based Dielectric Films for Integrated Circuits." IBM Journal of Research & Development. vol. 43, No. 1/2 (1999): 1-19.
Byun, Kyung-Mun et al. "Water Absorption Characteristics of Fluorinated Silicon Oxide Films Deposited by Electron Cyclotron Resonance Plasma Enhanced Chemical Vapor Deposition Using SiH4, SiF4 and O2." Thin Solid Films 376 (2000): 26-31.
Japanese Office Action mailed May 26, 2011 in corresponding Japanese Patent Application No. 2009-025759.
Switkes et al., "Resolution enhancement of 157nm lithography by liquid immersion," J. Microlith., Microfab., Microsys., vol. 1, No. 3, pp. 225-228 (Oct. 2002).

* cited by examiner

*Primary Examiner* — Daborah Chacko Davis
(74) *Attorney, Agent, or Firm* — Pillsbury Winthrop Shaw Pittman LLP

(57) ABSTRACT

A coating is disclosed. The coating may be used in an apparatus having a radiation source, e.g. a lithographic apparatus. The coating comprises the elements Si, O, F and, optionally, C and H. An article is also disclosed. The article may be any one of the group consisting of a substrate table, an optical element, a shutter member, a sensor, a projection system, and a confinement structure. At least a portion of a surface of the article is coated with a coating. The coating comprises the elements Si, O, F and, optionally, C and H. The coating may comprise the elements Si, O, C and H.

20 Claims, 6 Drawing Sheets

Fig. 7
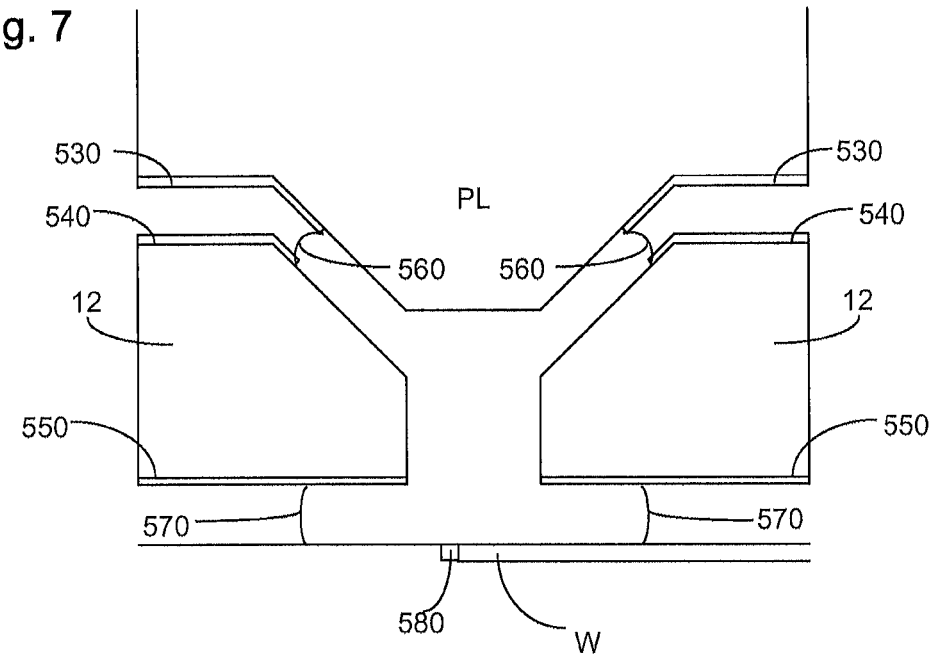
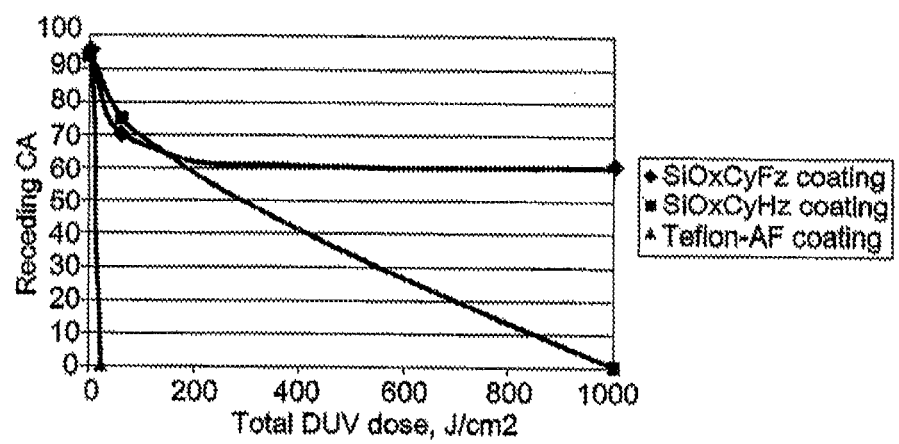
Fig. 8

COATINGS

This is a continuation of U.S. patent application Ser. No. 12/367,000, filed on Feb. 6, 2009, which application claims priority and benefit under 35 U.S.C. §119(e) to U.S. Provisional Patent Application Ser. No. 61/028,787, entitled "Coatings", filed on Feb. 14, 2008, and to U.S. Provisional Patent Application Ser. No. 61/193,203, entitled "Coatings", filed on Nov. 5, 2008. The entire content of each of the foregoing applications is incorporated herein in by reference.

FIELD

The present invention relates to coatings. An aspect of the invention concerns use of a coating in an apparatus with a radiation source, e.g. a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning structure, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning structure to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid may be distilled water (ultra pure water) although another high index liquid may be used. An embodiment of the present invention will be described with reference to liquid, e.g. a substantially incompressible and/or a wetting fluid. However, another fluid may be suitable, particularly a fluid with a higher refractive index than air, such as a hydrocarbon, such as a hydrofluorocarbon. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein.

One of the solutions proposed is for a liquid supply system to provide liquid on a localized area of the substrate and in between the final element of the projection system and the substrate using a liquid confinement system (the substrate generally has a larger surface area than the final element of the projection system). One way which has been proposed to arrange for this is disclosed in PCT Patent Application Publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

The immersion system may be a fluid handling system or apparatus. In an embodiment the fluid handling system may supply immersion fluid and therefore be a fluid supply system. In an embodiment the fluid handling system may confine fluid and thereby be a fluid confinement system. In an embodiment the fluid handling system may provide a barrier to fluid and thereby be a barrier member. In an embodiment the fluid handling system may create or use a flow of gas, for example, to help in handling immersion fluid. In an embodiment, immersion liquid is used as an immersion fluid. In that case the fluid handling system may be a liquid handling system.

In a solution which has been proposed, the fluid handling system is provided with a barrier member, which extends along at least a part of a boundary of the space between the final element of the projection system and the substrate table. The barrier member is substantially stationary relative to the projection system in the XY plane though there may be some relative movement in the Z direction (in the direction of the optical axis). A seal may be formed between the barrier member and the surface of the substrate. In an embodiment, the seal is a contactless seal such as a gas seal. Such a system with a gas seal is disclosed in United States Patent Application Publication No. 2004-0207824, hereby incorporated in its entirety by reference.

In European Patent Application Publication No. 1420300 and United States Patent Application Publication No. 2004-0136494, each of which is hereby incorporated in its entirety by reference, the idea of a twin or dual stage immersion lithography apparatus is disclosed. Such an apparatus is provided with two tables for supporting the substrate. Leveling measurements are carried out with a table at a first position, without immersion liquid. Exposure is carried out with a table at a second position, where immersion liquid is present. Alternatively, the apparatus may have only one table movable between exposure and measurement positions.

SUMMARY

Various parts in a lithographic apparatus may comprise a coating, for instance to protect the parts or to provide the parts with certain functionality, e.g. lyophobicity or lyophilicity. Functionality may, however, decrease over time due to the exposure of the coating to radiation, e.g. ultraviolet (UV) radiation (e.g., the radiation may degrade the coating) for example in the presence of an immersion liquid such as water.

In an embodiment, there is provided a coating comprising the elements Si, O, F and, optionally, C and H.

In an embodiment, there is provided a lithographic apparatus comprising a part having a coating comprising the elements Si, O, F and, optionally, C and H.

In an embodiment, there is provided an apparatus comprising a radiation source (e.g. UV source), the apparatus having a part with a coating comprising the elements Si, O, F and, optionally, C and H.

In an embodiment, there is provided the use of a coating of an embodiment of the invention to protect at least a portion of a surface of a lithographic apparatus from the effects of deep ultraviolet (DUV) radiation.

In an embodiment, there is provided an apparatus comprising a UV radiation source, the apparatus comprising a part having a coating comprising the elements Si, O, and F.

In an embodiment, there is provided a lithographic apparatus comprising at least a portion of a surface of a part having a coating comprising the elements Si, O, C and H.

In an embodiment, there is provided an article selected from the group consisting of a substrate table, an optical element, a shutter member, a sensor, a projection system, and a confinement structure, at least a portion of a surface of the article coated with a coating comprising the elements Si, O, F and, optionally, C and H.

In an embodiment, there is provided an article selected from the group consisting of a substrate table, an optical element, a shutter member, a sensor, a projection system, and a confinement structure, at least a portion of a surface of the article coated with a coating comprising the elements Si, O, C and H.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7 depicts a schematic cross-sectional view of an immersion system according to an embodiment of the invention;

FIG. 8 depicts a graph of the change in receding contact angle shown by SiOxCyFz, SiOxCyHz and Teflon-AF coated samples that have been subjected to DUV radiation;

FIG. 10a shows the changes observed for samples exposed to individual doses selected from the range of 1.2 to 77 $J/cm^2$/pulse and then left to dry for at least one minute and wherein this cycle is repeated until the sample has been exposed to the required total dose while FIG. 10b is an expanded view of the changes observed when the dose is 1.2 $J/cm^2$/pulse.

DETAILED DESCRIPTION

Figure 1:
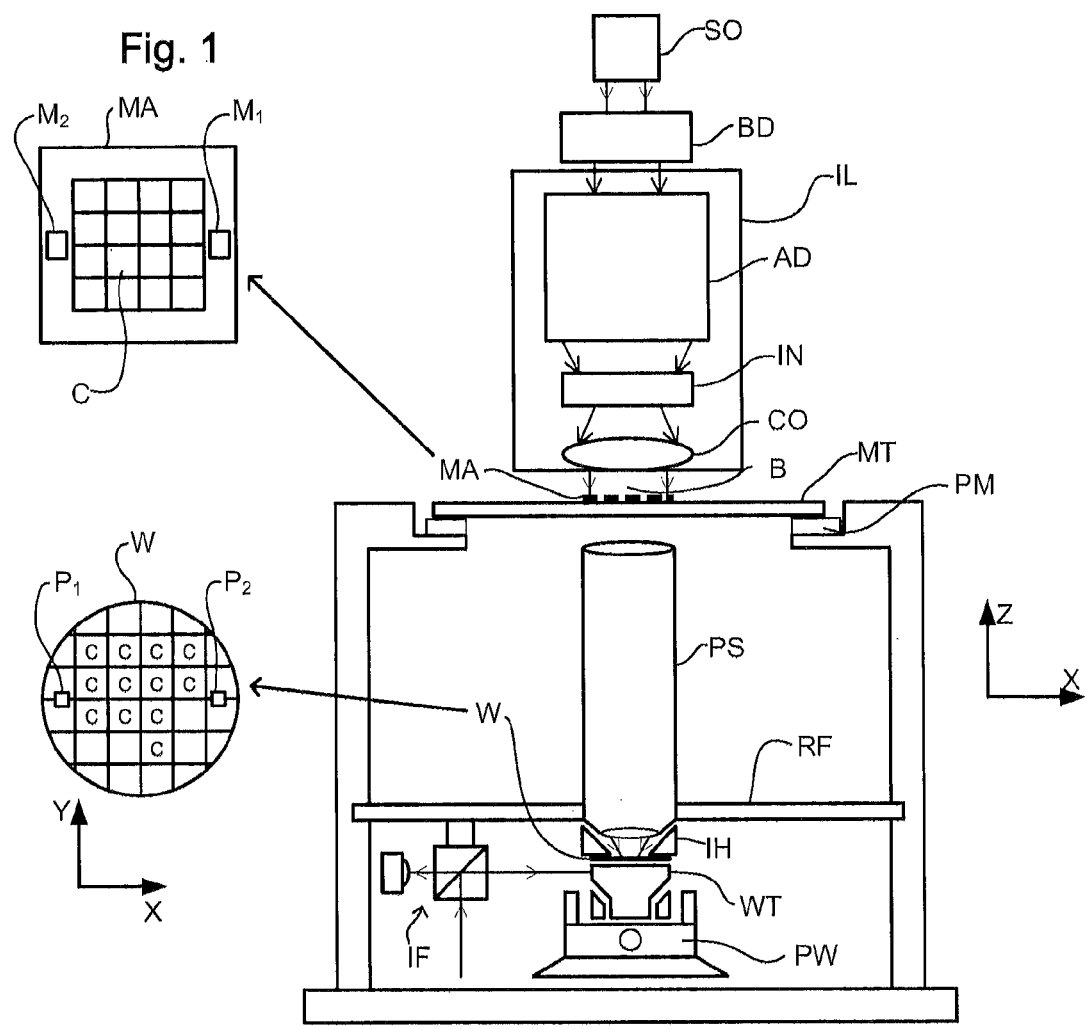
FIG. 1 depicts a lithographic apparatus according to an embodiment of the invention.
Figure 2:
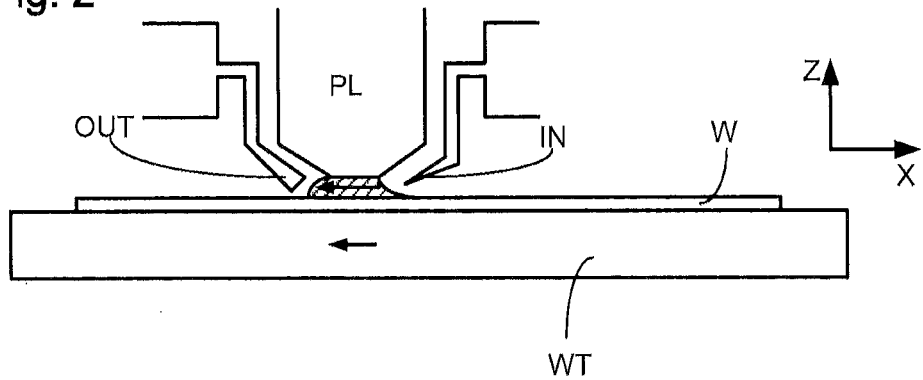
FIGS. 2 and 3 depict a liquid supply system for use in a lithographic projection apparatus.
Figure 3:
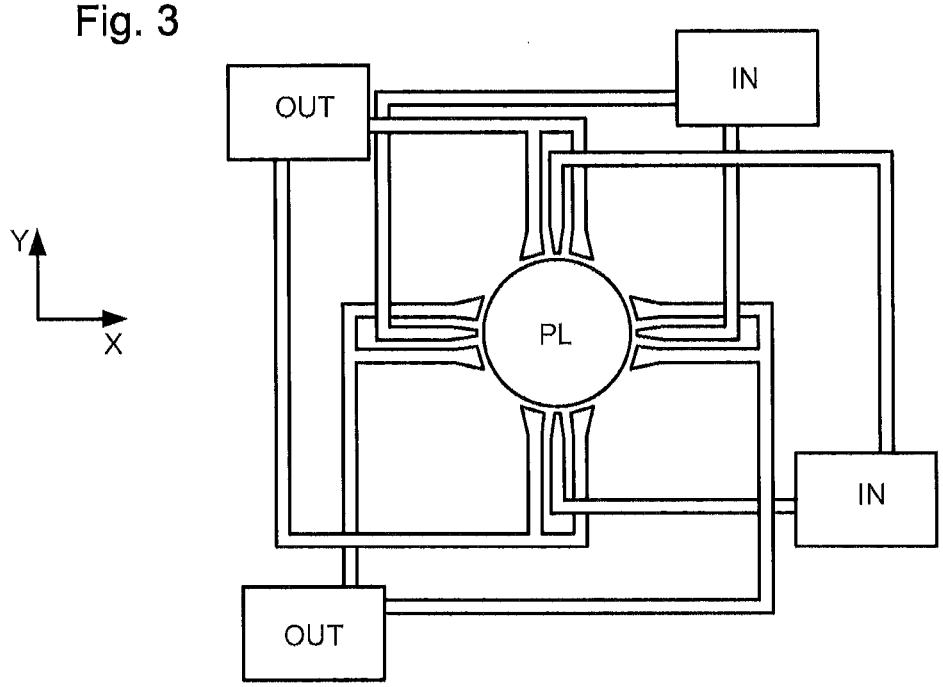
Figure 4:
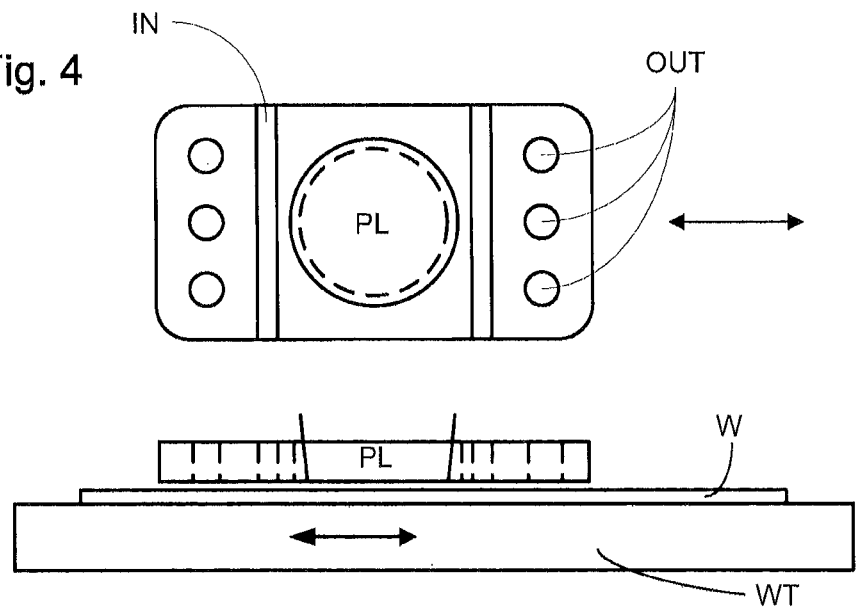
FIG. 4 depicts another liquid supply system for use in a lithographic projection apparatus.

FIG. 1 schematically depicts a lithographic apparatus according to an embodiment of the invention. The apparatus comprises an illumination system (illuminator) IL configured to condition a radiation beam B (e.g. UV radiation or DUV radiation); a support structure (e.g. a mask table) MT constructed to support a patterning structure (e.g. a mask) MA and connected to a first positioner PM configured to accurately position the patterning structure in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning structure MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning structure in a manner that depends on the orientation of the patterning structure, the design of the lithographic apparatus, and other conditions, such as for example whether or not the patterning structure is held in a vacuum environment. The support structure can use mechanical, vacuum, electrostatic or other clamping techniques to hold the patterning structure. The support structure may be a frame or a table, for example, which may be fixed or movable as required. The support structure may ensure that the patterning structure is at a desired position, for example with respect to the projection system. Any use of the terms "reticle" or "mask" herein may be considered synonymous with the more general term "patterning structure."

The term "patterning structure" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning structure may be transmissive or reflective. Examples of patterning structures include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning structure (e.g., mask) MA, which is held on the support structure (e.g., mask table) MT, and is patterned by the patterning structure. Having traversed the patterning structure MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning structure MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning structure MA and substrate W may be aligned using patterning structure alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning structure MA, the patterning structure alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning structure, and the substrate table WT is moved or scanned while a pattern imparted to the radiation beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations and/or variations on the above described modes of use or entirely different modes of use may also be employed.

Figure 5:
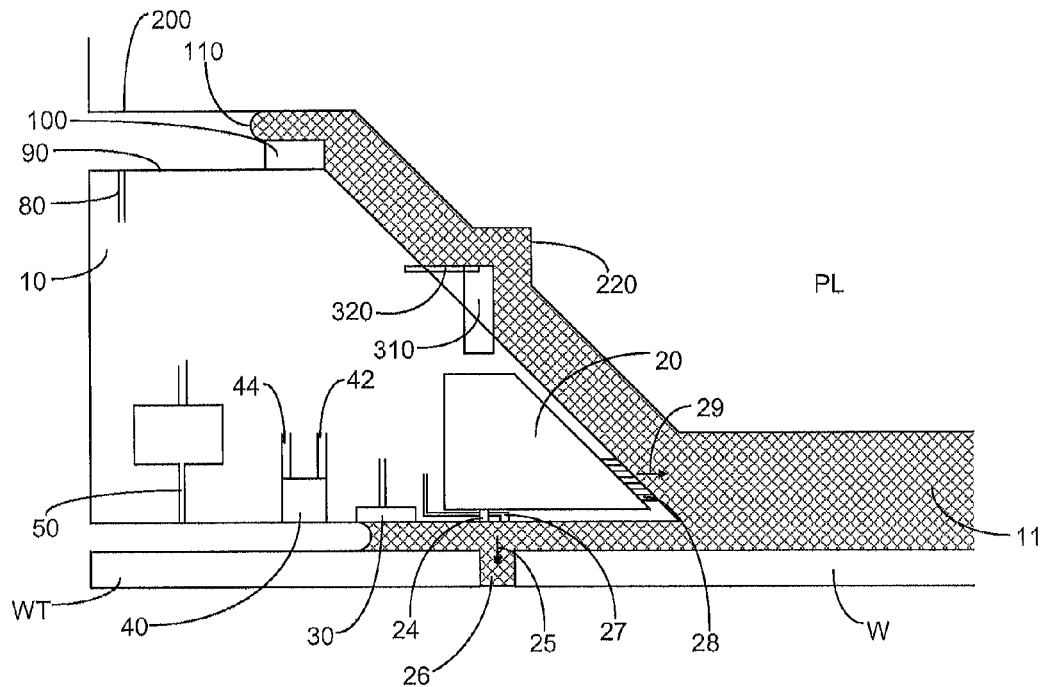
FIG. 5 depicts, in cross-section, a liquid supply system according to an embodiment of the invention.

FIG. 5 illustrates, in cross-section, a liquid supply system, which is shown in FIG. 1 as IH, in accordance with an embodiment of the invention. The liquid supply system comprises a barrier member 10 which at least partly or completely surrounds a space between the projection system PL and the substrate W and has a barrier surface that defines, along with the projection system PL and the substrate W (and/or the substrate table WT), a reservoir for the liquid 11. In this way, liquid 11 can be provided in that space so that the patterned radiation beam that is projected through the projection system PL onto the substrate W passes through the liquid 11.

In an embodiment, a contactless seal may be formed between the barrier member 10 and the substrate W (or substrate table WT when an edge of the substrate W is being imaged). In the illustrated embodiment, the contactless seal comprises a liquid removal device 30, a recess 40 radially outwardly of the liquid removal device which has, at a radially inwardly top surface, a gas inlet 42 and, at a radially outwardly surface, a gas outlet 44. An optional gas knife 50 may be provided radially outwardly of the recess 40. The arrangement of these three items on the bottom surface of the barrier member 10 is described in detail in United States patent application publication no, 2006-0158627, hereby incorporated in its entirety by reference. Details of the liquid removal device 30 are disclosed in United States patent application publication no. 2006-0038968, hereby incorporated in its entirety by reference. Instead of or in addition to a contactless seal, and gas knife, the barrier member may have a series of gas drag apertures.

As shown in the embodiment represented by FIG. 5 (by way of example), liquid may be provided by the barrier member 10 to a chamber 20 at high pressure. The liquid enters the space between the projection system PL and the substrate W through one or more inlets 28 in a substantially horizontal direction (i.e. substantially parallel to the top surface of the substrate W as illustrated by arrow 29). Liquid also exits the chamber 20 through one or more inlets 24 which direct the flow of liquid in a direction away from the projection system PL vertically downwards as illustrated by arrow 25 (towards the substrate W). This flow of liquid is intended to fill a gap 26 which is usually present between the substrate W and the substrate table WT and also to keep the meniscus under the barrier member 10 radially outwardly of the inner side of the liquid removal device 30 especially during scanning of the substrate W under the barrier member 10. The filling of this gap 26 with the flow of liquid out of inlet 24 may reduce the occurrence of bubbles in that gap.

In an embodiment, the inlet 24 comprises a series of discrete holes positioned in a circle (or other shape) around the image field of the projection system PL. The purpose of this inlet and these holes is to prevent the meniscus between the barrier member 10 and the substrate W from being drawn into the space between the projection system PL and the substrate W when an edge of the substrate W is being imaged or when the scan speed exceeds a certain magnitude. If gas (e.g., air) from the outward side of the meniscus is included under the projection system during relative movement of substrate W to the projection system PL, this may deleteriously affect the imaging quality. However, with a series of discrete holes, gas may get trapped between the holes and thereby build-up in the gap 26 between the substrate W and substrate table WT. Such bubbles may then enter the liquid 11 between the substrate W and the projection system PL. For this reason, one or more outlets 27 are also provided next to the inlet 24 and a mixture of gas and liquid is extracted through the outlet 27 so that any gas trapped in the gap 26 can escape and liquid can fill the hole of the gap 26 without trapping any gas bubbles. The outlet 27 may be connected to a chamber (not illustrated), such as the chamber 20, to reduce pressure fluctuations at the outlet 27. The outlet 27 may comprise a series of discrete holes positioned in a circle (or other shape) around the image field of the projection system PL. In an embodiment, there is provided an inlet 24 that forms an outer perimeter of holes and an outlet 27 that forms an inner perimeter of holes so that when the gap 26 passes under the inlet 24 and outlet 27, the gap 26 is first filled by inlet 24 and then the bubbles are extracted by outlet 27. However, the precise positioning of the inlet 24 and outlet 27 may be otherwise so long as the function is achieved. The outlet holes 27 may also be used to extract liquid that could be contaminated by resist dissolving under the projection system. With such extraction the liquid near the meniscus (near the liquid removal device 30) will be less contaminated. The liquid that is left behind on the substrate W during scanning may then also be less contaminated and therefore the amount of particles left behind on the substrate may be reduced as may drying stains following liquid removal.

The barrier member 10 may be generally shaped to conform with the outer shape of the projection system PL such that a constant gap exists between the projection system PL and the barrier member 10. A gap is present in order that independent relative movement of the projection system PL and barrier member 10 is possible.

In an embodiment, measures are taken in order to deal with variations in the volume of the reservoir and variations in liquid supply/extraction from the reservoir. Under normal conditions, the top surface of the liquid 11 has a meniscus 110 which is substantially stationary relative to the projection system and the barrier member 10. The top surface 90 of the barrier member 10 is a horizontal surface which is flat and liquid is only allowed to be present on the top surface 90 in emergency situations. In order to deal with emergency situations, an outlet 80 is provided in the top surface 90. Once the meniscus 110 is on the top surface 90 it can advance easily and the barrier member 10 is likely to overflow. In order to help prevent this, a protrusion 100 may be provided on the top surface 90 of the barrier member 10 at an inner most edge of the barrier member. The protrusion 100 may extend around the barrier member 10 and thus may form a ring or other enclosing shape. The protrusion 100 may be closer to the surface of the projection system FL, in particular the horizontal surface 200 of the projection system PL, than parts of the barrier member 10 surrounding the protrusion 100 are to the projection system PL.

In an embodiment, there is a step change in distance from between the protrusion 100 and the projection system PL to between the barrier member 10 and the projection system PL. This step change can be seen on the left hand side of the protrusion 100 in FIG. 5. In an embodiment, this step change is on the radially outwardly side of the protrusion 100 but may also or optionally be present on the radially inward side of the protrusion 100 as is the case in FIG. 5. This geometry means that in order for the meniscus 110 of the top of the liquid 11 to pass the protrusion 100, the length of the meniscus 110 will need to increase which requires a great deal of energy.

In an embodiment, surfaces of both the protrusion 100 and the projection system PL in the region of the protrusion are formed of a liquid repellent or lyophobic material. For example, a material which is oleophobic for a hydrocarbon liquid (e.g., an oil) or hydrophobic for water. With a surface made of a lyophobic material, the liquid makes a contact angle, for example a static contact angle, with the surface under stationary conditions of generally greater than 90°, such as 100°, 110°, 120° and 130°, for example selected from the range of 90 to 130° or the range of 100 to 120° at the operating temperature of the immersion liquid in the reservoir, for example, during exposure. Under stationary conditions, the shape of the meniscus 110 is convex when viewed from outside of the liquid. With movement parallel to the plane of the surface, the receding contact angle of the liquid relative to the surface is in the range between 50 and 100 degrees, such as between 50 to 90 degrees, desirably more than 60 degrees. In an embodiment it may be between 80 and 86 degrees. The advancing contact angle is in the range of 90 to 130 degrees, desirably less than 120 degrees. In an embodiment, the advancing contact angle is between 90 and 100 degrees. All these contact angles are defined at a normal operating temperature of the immersion system, for example 22 degrees Celsius.

Thus, the provision of a step increase in the distance between the surface of the projection system PL and the barrier member 10 in a radially outward direction may significantly decrease the chances of overflow when using a barrier member 10.

The protrusion 100 is illustrated as being on the barrier member 10. However, this need not be the case and the protrusion may be on the projection system, so long as the same function (i.e. providing an energy barrier for the meniscus to overcome to move past the protrusion) is fulfilled.

Also illustrated in FIG. 5 is an embodiment of a system in which the inner surface of the barrier member 10 facing the projection system PL is deliberately misformed such that it more closely resembles the outer surface of the projection system PL which may also be deliberately misformed. In this way, a labyrinth is created for the liquid 11 to flow up towards the protrusion 100 from the substrate and this increases the flow restriction and thereby decreases the risk of overflowing. Thus, the path which the liquid would need to take in order to overflow over the barrier 10 would be tortuous and require at least three changes of direction. In the illustrated embodiment, this may be achieved by the provision of an indentation 220 in a side wall of the projection system PL. A protrusion may be provided on the inner side wall of the barrier member 10 (in the barrier surface), and may be formed by two elements 310, 320. Other measures can also be taken in order to increase the tortuousness of the path for liquid to follow from a position between the projection system PL and the substrate W to the top of the barrier member 10. The indentation 220 and/or elements 310, 320 may be used with or without the protrusion 100, and with or without the lyophobic coatings discussed in greater detail below.

In an embodiment, the lithographic apparatus comprises one or more parts with a coating. In an embodiment, those one or more include a coating comprising the elements Si (silicon), O (oxygen), F (fluorine) and, optionally, C (carbon) and H (hydrogen). In an embodiment the mentioned elements are present in a chemical compound present in the coating. In an embodiment, the coating consists essentially of these elements (Si, O, F and, optionally C and H). In an embodiment, the coating consists of these elements. In an embodiment, the coating consists essentially of the elements Si, O, F, H, and C. In an embodiment, the coating consists of the elements Si, O, F, H, and C.

In an embodiment, F is covalently bonded to Si and/or C. In an embodiment, O is covalently bonded to Si.

In an embodiment the coating is amorphous.

In an embodiment, the coating is an atomic-scale interpenetrating random network. Such a structure may be considered to be amorphous. The network may comprise C:H/C:F, or Si:O/Si:F or both. It is desirable that the coating contains silicon. The coating may be referred to as an atomic scale interpenetrating random network of a-C:H/a-Si:O in the presence of fluor covalently bonded to C or Si. The fluor may be bonded to the C in a diamond-like structure (e.g. a-C—H) network. The fluor may be bonded to the Si in a quartz-like structure (a-Si:O) network. In an embodiment, in the case of a fluorinated a-Si:O network only the quartz-like network is present.

A coating which comprises Si, O, F, H and C can be referred to as a SiOxCyFz coating. In an embodiment, such a coating comprises a network of Si:O/Si:C and C:H/C:F. In an embodiment, the SiOxCyFz coating comprises a network of Si:O/Si:F/Si:C and, optionally, a H/C:F.

A coating which comprises Si, O, F (i.e. C and H are not present) can be referred to as a SiOxFy coating. In an embodiment, the SiOxFy coating comprises a network of Si:O/Si:F.

In an embodiment, the one or more parts of the lithographic apparatus include one or more members selected from the group consisting of a sensor, a substrate table, a shutter member (e.g. a swap bridge or a closing disk), a fluid handing structure (e.g. a liquid confinement structure), a projection system, and an optical element. In an embodiment, the optical element is a lens, such as a last lens element.

In an embodiment, the molar ratio between Si and O is in the range of 1:1<Si:O<1:2. In an embodiment, Si:O<1:1.8, Si:O<1:1.6, or Si:O<1:1.4. In an embodiment, Si:O is about 1:1.2. Each of these ratios is desirable as the initial molar ratio before first exposure. With each exposure, more energy is supplied to a portion of the surface exposed to the radiation, increasing the exposure duration for which the portion is exposed. The energy in a radiation beam is sufficient to alter the chemical composition of the surface, for example to increase the Si:O ratio. So with an increase in duration of exposure, the Si:O ratio can increase. In an embodiment, an initial ratio of Si:O may be 1:1.2 and after exposure to a total DUV dose of 1000 J/cm$^2$ the ratio may be 1:1.9.

In an embodiment, the molar ratio between Si and C (when C is present) is in the range of 1:0.1<Si:C<1:2.5. In an embodiment, 1:0.4<Si:C, 1:0.8<Si:C, 1:1.2<Si:C, 1:1.6<Si:C, or even 1:2<Si:C. In an embodiment, the ratio Si:C is about 1:2.1. With increased exposure to the radiation beam, the ratio may change, for example it may decrease. In an embodiment an initial ratio of Si:C may be 1:2.1 and after exposure to a total DUV dose of 1000 J/cm$^2$ the ratio may be 1:0.7.

In an embodiment, the molar ratio between Si and F is 1:0.1<Si:F<1:2. In an embodiment, Si:F<1.6, Si:F<1.2, or even Si:F<0.8. In an embodiment, Si:F is about 1:0.4. With increased exposure to the radiation beam exposure, the ratio may change, for example it may decrease. In an embodiment an initial ratio of Si:F may be 1:0.4 and after exposure to a total DUV dose of 1000 J/cm$^2$ the ratio may be 1:0.2.

The coating may comprise silicon, oxygen, fluorine and optionally carbon and hydrogen. The molar ratio of silicon to oxygen may be in the range 1:1<Si:O<1:2. The molar ratios of the elements present may be determined by chemical analysis using, for example, X-ray photoelectron spectroscopy. The coating may comprise the following proportions of silicon, oxygen, fluorine and carbon (when present), where the proportions are based on the atomic number of each element, ignoring hydrogen:

i) from 10 to 40, desirably 15 to 30, such as 19 to 26, atomic percent of silicon;
ii) from 15 to 60, desirably 20 to 54, such as 23 to 49 atomic percent of oxygen;
iii) from 3 to 40, desirably 5 to 30, such as 4 to 17, atomic percent of fluorine; and
iv) from 10 to 50, desirably 15 to 45, such as 19 to 40, atomic percent of carbon.

In general, in this type of fluorine-containing coating, the fluorine content will have an effect on the lyophobic property of the coating. The coating can be more lyophobic when it has a greater content of fluorine. However, if the fluorine content decreases, for example through exposure to a radiation beam, each of the decrease in fluorine and increase in duration of exposure can be associated with an increase in the nanoroughness of the surface. The lyophobic property of the coating can be affected by the nanoroughness of the surface. An increase in nanoroughness may be associated with an increase in lyophobicity. Thus, a coating which loses fluorine but increases in surface nanoroughness can substantially maintain its lyophobic property.

In an embodiment, the coating is a diamond-like nanocomposite (DLN) film. In an embodiment, the coating is a DLN film which comprises F. In an embodiment, the coating is a DLN film comprising Si, O, F and, optionally, C and H. In an embodiment, the coating is a DLN film that consists essentially of Si, O, F and, optionally C and H. In an embodiment, the coating is a DLN film that consists of Si, O, F and, optionally C and H. In an embodiment, the coating is a DLN film that consists essentially of the elements Si, O, F, H, and C. In an embodiment, the coating is a DLN film that consists of the elements Si, O, F, H, and C.

The coating may be a formed from a single compound or from a mixture of two or more compounds. In an embodiment, a 2-part system is used, i.e. a matrix material and an inclusion material. In an embodiment, the matrix material is a silicon oxide material such as a polysiloxane, e.g. a poly(dimethylsiloxane), or a polysilazane, e.g. an organopolysilazane. In an embodiment, the silicon oxide material is based on a silicon oxide prepared by a sol-gel technique using silane chemistry.

The inclusions, for instance, may be fluoro-molecules (i.e. molecules containing the element fluorine). A combination or selection of fluoro-molecules can be used. In an embodiment, the fluoro-molecules are a fluoro-dendrimer, a fluoro-oligomer, such as a branched or star shape fluoro oligomer, or a fluoro-silane. In an embodiment, the inclusions can be molecules containing at least any one of carbon, silicon, hydrogen, oxygen, nitrogen and/or fluorine. In an embodiment, the content of the inclusion material in the matrix material is at least 0.1 vol %, e.g. at least 1 vol %, at least 5 vol %, or at least 10 vol %. In an embodiment, the content of the inclusions in the matrix is less than 40 vol %, e.g. less than 30 vol %, less than 20 vol %, or less than 10 vol %. In an embodiment, the content of the inclusions is selected from the range of 0.1 vol % to 40 vol %, for example the range of 1 vol % to 30 vol % or the range of 5 vol % to 20 vol %. When the coating comprises such a 2-part system and is an SiOxCyFz coating it may be formed of a matrix of Si:O/Si:C and have a C:F/C:H additive. In an embodiment, the C:F/C:H additive can provide additional lyophobicity and recovery to the coating when it has been exposed to UV radiation, such as DUV radiation.

In an embodiment, the coating has a thickness selected from the range of 10 nm to 2 µm, for example the range of 50 nm to 1 µm. In an embodiment, the coating has a thickness selected from the range of 400 nm to 1.5 µm, such as the range of 1 µm to 1.4 µm. In an embodiment, the coating has a thickness selected from the range of 0.8 µm to 1.2 µm.

In an embodiment, the thickness of the coating is less than about 100 microns, e.g. less than 60 microns, less than 20 microns, less than 10 microns, less than 5 microns, less than 3 microns, or even less than 1 micron. In an embodiment, the thickness is at least about 10 nm, e.g. at least 20 nm, at least 50 nm or at least 100 nm.

In an embodiment the coating comprises a silicon oxide network. During exposure, some of the UV radiation may impart on a portion of the coating which may be covered by immersion liquid, for example water. In such an environment the coating may react under the influence of the UV radiation to strengthen the silicon oxide network. However, the coating may recover and/or maintain its lyophobic property, for example it may retain and/or recover its lyophobic property. In an embodiment, the coating may have an improved UV resistance, for example, in an immersion liquid such as water.

Typically, a roughened surface exhibits a lyophobic property. Combined with a lyophobic property of the remaining fluorinated molecules, the roughened surface generally maintains the surface of the coating surface as lyophobic. The coating may substantially or fully recover its lyophobic property when left to dry.

The manner of applying the coating may vary. In an embodiment, the coating is a wet-chemically applied coating, i.e. by applying the coating as a solution of the components in a solvent and allowing the solvent to evaporate. In an embodiment, the coating is applied in a vacuum by a chemical vapor deposition (CVD) technique.

The coating can be applied in vacuum. In an embodiment, the coating is applied by chemical vapor deposition (CVD) by a technique which may be (but not limited to) magnetron sputtering, ion beam deposition, induced coupled plasma chemical vapour deposition (ICP CVD), microwave plasma chemical vapour deposition or plasma-enhanced chemical vapor deposition (PECVD). In an embodiment, the coating is applied by PECVD, PECVD and associated pre-cursors are mentioned in, e.g., U.S. Pat. No. 5,563,105 and U.S. Pat. No. 6,518,646, which are hereby incorporated in their entirety by reference. For instance, in an embodiment, a combination of $Si_aH_b$ and $Si_xF_y$, such as $SiH_4/SiF_4/O_2$, is used as a pre-cursor. Here a and b represent the molar ratio of silicon and hydrogen while x and y represent the molar ratio of silicon and fluorine. The following description refers to plasma deposition techniques. Where applicable, the comments may apply to the other possible vapor deposition techniques, including CVD.

In an embodiment, a carbon comprising compound is used instead of, or in addition to, $SiH_4$, for instance tetraethoxysilane (TEOS), hexamethyldisilane (HMDS), hexamethyldisilazane (HMDSN), or desirably hexamethyldisiloxane (HMDSO). The carbon containing compound may be the main monomer for the coating. Fluorine may be incorporated into the coating using a fluorine containing gas, which may comprise carbon, for example: $CF_4$ (tetrafluoromethane), $C_2F_4$ (tetrafluoroethylene), $C_2F_6$ (hexafluoroethane) or $HCF_3$ (trifluoromethane). The fluorine containing gas may comprise silicon, for example: trifluoromethyltrimethylsilane, $SiF_4$ (silicon tetrafluoride), or any other gaseous compound of $Si_xF_y$. In the case of $SiF_4$, a hydrogen based pre-cursor, such as $SiH_4$ or $H_2$, may be used to neutralize the fluorine ions. In such a technique, an assistant gas such as methane or acetylene may be used. A non-polymerizable gas such as a noble gas e.g. argon, oxygen, nitrogen and/or hydrogen may be used to increase the pressure in the gas and improve the homogeneity of the eventual coating. In an embodiment, hydrogen is added to neutralize fluoro ions. Examples of compositions from which the coating can be prepared are $SiH_4/SiF_4/O_2$ (see for example Solid Films, 2006, 376, 26 hereby incorporated in its entirety by reference) $SiH_4/SiF_4/O_2/Ar$ (see for example IBM J. Res. Develop, 1999, 43, 109 hereby incorporated in its entirety by reference), $TEOS/SiF_4/O_2$ (see, for example, U.S. Pat. No. 5,563,105 hereby incorporated in its entirety by reference or U.S. Pat. No. 6,518,646 hereby incorporated in its entirety by reference). The skilled person would be aware of a suitable CVD technique to apply the coating. Examples of such technique are described in U.S. Pat. No. 7,157,145 B2 (hereby incorporated in its entirety by reference), Plasmas and Polymers, vol. 6, 2001, pg 221 (hereby incorporated in its entirety by reference), Phys. State. Solid (a) vol 145, pg 575 1994 (hereby incorporated in its entirety by reference) and Surf Coat Technol. Vol 76-77, pg 367, 1995 (hereby incorporated in its entirety by reference).

A skilled person would be aware that Phys. State. Solid (a) vol 145, pg 575 1994 and Surf Coat Technol. Vol 76-77, pg 367, 1995 disclose examples of fluoro-containing precursor materials for C:F bond formation. These precursors when used together with HMDSO or a similar chemical (as described in Appl. Phys. Letter, Vol 82, pg 3526 (hereby incorporated in its entirety by reference) would provide a coating comprising C—F bonds.

In an embodiment of the PECVD technique, the process begins with a composition of monomer/assistant gas/non-polymerizable gas and then during the process the assistant gas is gradually replaced with a fluoro-containing gas. In an embodiment of the PECVD technique, the process begins with a composition of HMDSO/acetylene/argon and then during the process the acetylene is gradually replaced with $C_2F_4$ or $HCF_3$.

In an embodiment, if TEOS is used as the monomer and SixFy is used as the fluoro-containing gas, the resultant coating will comprise a Si:O/Si:F network. In an embodiment, if HMDSO, HMDS or HMDSN is used as the monomer and SixFy is used as the fluoro-containing gas, the resultant coating will comprise a Si:O/Si:F/Si:C network. In an embodiment, if HMDSO, HMDS or HMDSN is used as the monomer and CxFy is used as the fluoro-containing gas, the resultant coating will comprise Si:O/Si:C and C:H/C:F networks.

For a plasma embodiment of the method, the created coating may have a thickness of 2 μm or less, desirably 1 μm or less, but more desirably less than 500 nm or 300 nm. In an embodiment, the coating applied by a plasma method has a thickness between 200 nm and 1 μm, for example between 400 nm and 600 nm.

In an embodiment, the deposition of the coating by chemical vapor deposition is performed gradually while increasing the concentration of the fluoro-containing molecules. Deposition in this manner can result in good adhesion between the coating and surface on which it is applied.

The coating applied by a plasma deposition technique may have a high thickness homogeneity. Thus the thickness of the coating may follow the contours of the coated surface. The applied coating may have good adhesion to a material (in a non-limiting list) such as glass, metal, plastic and ceramic.

In a plasma deposition technique, a non-polymerizable gas, for example oxygen, a noble gas such as argon, and nitrogen may be added to the monomer to improve the homogeneity of the plasma. The use of a non-polymerizable gas may increase the pressure of the pre-cursor (monomer) when in the gas phase.

In an embodiment of the plasma applied coating comprising carbon, reaction under the influence of UV radiation damages a carbon-fluoride network. The coating may roughen. The roughening may be caused by a loss of carbon from the coating. Although continued exposure may remove more carbon, substantially some carbon may remain in the coating. The roughening is more likely to occur on exposure to UV radiation. Therefore roughening will occur to a greater extent on a surface which is more likely to be exposed directly to UV radiation, such as during exposure. Such a surface may include a sensor and the surface of a substrate table. The surface may be the surface of a sensor, a substrate table or both. The roughening may be observed to be roughening on a nanoscale.

In an embodiment of a wet-chemical applied coating, the coating is applied at a relatively low temperature, such as room temperature. Examples are, for instance, spraying, spin coating or brushing.

A wet chemical application technique may be used to coat a material which is not vacuum compatible or which has a shape which cannot readily be coated using a CVD technique.

In an embodiment of a coating applied by the wet-chemical technique, the coating matrix is applied directly to the surface and may then be cured at an elevated temperature of up to 475 Kelvin (200 degrees Celsius). In an embodiment, the coating may be cured at room temperature (20 degrees Celsius) using a technique such as EB (electron beam), UV and/or microwave heating.

In an embodiment, a coating applied by a wet chemical technique may have a thickness selected from the range of 10 nm to 100 μm, such as the range of 10 nm to 20 μm or the range of 10 nm to 2 μm, for example the range of 200 nm to 1 μm.

In an embodiment of a coating applied by the wet-chemical technique, the coating may recover and so maintain its lyophobic property. This may be achieved by the high mobility of the long-chain, branched fluoro-functional molecules in the coating.

The skilled person would be aware of a suitable wet chemical technique to apply the coating.

In an embodiment, the coating comprises the elements Si, O, C and H. In an embodiment, the coating consists essentially of Si, O, C and H. In an embodiment, the coating consists of Si, O, C and H. Such a coating can be an atomic-scale interpenetrating random network. Such a structure may be considered to be amorphous. The network of such a coating may comprise Si:O/Si:C wherein the hydrogen is present in the form of C:H. A coating which comprises the elements Si, O, C and H may be referred to as a SiOxCyHz coating.

When the coating comprises the elements Si, O, C and H, the molar ratio between Si and O can be in the range of $1:1<Si:O<1:6$, for example $1:2<Si:O<1:6$. Each ratio is desirable as the initial molar ratio before first exposure. With each exposure, more energy is supplied to the surface, increasing the exposure duration of the surface. The energy in a radiation beam is sufficient to alter the chemical composition of the surface, for example to increase the Si:O ratio. So with increased exposure duration, the Si:O ratio can increase. For example, an initial Si:O ratio of 1:1.2 may increase after exposure to a DUV dose of 1000 mJ/cm$^2$ to become 1:1.5.

When the coating comprises the elements Si, O, C and H, the molar ratio between Si and C can be in the range of $1:0.5<Si:C<1:2.5$ for example $1:1.0<Si:C<1:2.0$, such as $1:1.2<Si:C<1:1.9$. With increased exposure to the radiation beam, the ratio may change, for example it may decrease. For example, an initial Si:C ratio of 1:1.8 may decrease after exposure to a DUV dose of 1000 mJ/cm$^2$ to become 1:1.3.

The coating may be produced in a similar manner to the fluorine containing coating, but without the use of fluorine-containing molecules. Thus features such as the thickness of the coating described above for the fluorine-coating coating is equally applicable to the Si, O, C and H containing coating. The skilled person would be aware how to produce such a coating. In an embodiment, the coating is applied using PECVD. Suitable monomers for producing such a coating are HMDSO, HMDS, HMDSN and TEOS. In an embodiment, the monomer used to produce the coating is HMDSO. A non-polymerizable gas such as a noble gas, e.g. argon, oxygen or nitrogen can be added to the monomer to improve the homogeneity of the plasma and increase the pressure in the gas phase. An example of a composition from which such a coating could be prepared by a CVD technique (for example a PECVD technique) is HMDSO/O$_2$. Examples of suitable techniques for producing such a coating are described in U.S. Pat. No. 7,157,145 B2 (hereby incorporated in its entirety by reference) and Plasmas and Polymers, vol. 6, 2001, pg 221 (hereby incorporated in its entirety by reference).

When the coating comprises the elements Si, O, C and H, the molar ratios of the elements present determined by chemical analysis using, for example, electron spectroscopy may be, based on the atomic number of each element and ignoring hydrogen:

i) from 15 to 35, desirably 20 to 30, such as 25 to 26, atomic percent of silicon;
ii) from 20 to 55, desirably 25 to 45, such as 30 to 40, atomic percent of oxygen;
iii) from 20 to 55, desirably 30 to 50, such as 33 to 45, atomic percent of carbon.

When the coating comprises the elements Si, O, C and H, such a coating may exhibit a relatively slow degradation of contact angle when exposed to low doses of UV radiation, for example 1.2 J/cm$^2$ or less. In an embodiment, such a coating may be used on a closing disc (shutter member), a sensor, a last optical element, or the top and/or bottom surface of the immersion hood of a lithographic apparatus. In an embodiment, the coating is used on the substrate table. This is in the direct path of the exposing radiation but the exposure dose is in the region of 0.55 mJ/cm$^2$/pulse.

Figure 6:
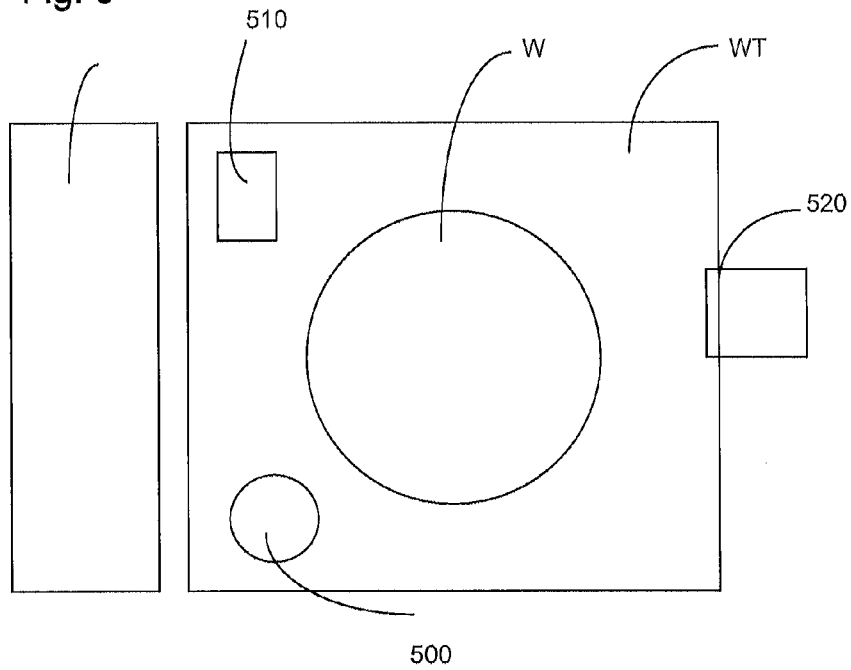
FIG. 6 depicts a schematic plan view a substrate holder of an immersion system according to an embodiment of the invention.

One or more specific features of an immersion system to which the coating may be applied are shown in FIGS. 6 and 7. FIG. 6 depicts features which may be present on a substrate table WT. In an embodiment, the article is a substrate table WT. In an embodiment, the article is a sensor 510. For instance the sensor 510 may be a transmission image sensor (TIS), a lens interferometer sensor (ILIAS) or a spot sensor. It is desirable to coat a TIS because it may enable the cleaning of the TIS without substantial loss in a lyophobic property of the coating.

In an embodiment, the article is a shutter member 500, 520, 525 (i.e. an element assisting in containing the immersion liquid when no substrate is being exposed, for example during substrate swap; see, e.g., U.S. Pat. No. 7,110,081 which is hereby incorporated in its entirety by reference) such as a closing disk 500, a bridge 520 (see e.g. United States patent application publication no. US 2007-0216881 which is hereby incorporated in its entirety by reference), or a second stage 525 such as a measurement stage. The bridge 520 may be positioned between at least two stages in a multi stage apparatus during substrate swap. The surface of the bridge between the stages may be moved under the confinement structure 12. The bridge 520 and the closing disc 500 may be alternatives. The second stage 525 may be moved so that it adjoins to an edge of the substrate table WT during substrate swap. The surface of the substrate table may be moved under the confinement structure 12 so that the confinement structure 12 is located above the second stage 525. In an embodiment the second stage 525 is a measurement stage and does not support a substrate. The measurement stage 525 may have any of a sensor, a measurement tool and a cleaning station. The liquid confinement structure 12 may be returned to a substrate table WT to complete substrate swap. In an embodiment, the second stage 525 is a second substrate table. The second stage 525 may be used as an alternative to the closing disc 500 or the bridge 520, or it may be used in combination with one of them or both of them.

The substrate table WT may include at least some of the other components such as a sensor 510 and a shutter member 500, 520, e.g. a closing disc 500 or a bridge 520. The coating may be applied to these features together, in combination or separately.

FIG. 7 depicts a cross-section through a confinement structure 12, a part of the projection system PL and a part of the substrate table WT. In an embodiment, the article is a confinement structure 12 (or seal member or barrier member) which may comprise at least part of a fluid/liquid supply system. In an embodiment, the coating is present at least on a part of the surface 540 of the confinement structure 12 facing away from the substrate table. This may be desirable for controlling a meniscus 560 of immersion liquid between the projection system PL and the confinement structure 12. The coated portion 540 may reduce the chance of immersion liquid escaping from between the confinement structure 12 and the projection system PL and from sloshing (causing cold spots caused by evaporation of the immersion liquid).

In an embodiment, the coating is present at least on a part of the surface 550 of the confinement structure 12 facing the substrate table WT. This may enable control of a meniscus 570 of immersion liquid between the substrate table WT and the confinement structure 12 to be improved. The improvement may be more desirable when the substrate table WT is coated with a similar coating as well.

In an embodiment, the article is an optical element. In an embodiment, the optical element is a lens. In an embodiment, the coating is present at least on a part of the projection system PL. In an embodiment, the coating is present at least on a part 530 of the projection system PL that faces the substrate table. Desirably, the part of the projection system surface on which the coating is present is away from a part through which the radiation beam B passes, such as during exposure. For example, the coating is applied to the surface 530 of the last optical element away from the optical axis of the projection system PL. The location of the coating may reduce the risk of immersion liquid from escaping the immersion space as described above.

When a substrate W is held by the substrate table WT, the surface of the substrate W may be substantially co-planar with the substrate table WT. There may be a gap in the planar surface between the substrate W and the substrate table WT. The gap may define a recess 580. As the recess 580 passes under the liquid confinement structure 12, bubbles may become entrained in the immersion liquid. The bubbles may affect the optical quality of the immersion liquid in the liquid confinement system 12, beneath the projection system PL and so be a possible source of defects. A system, such as a bubble extraction or reduction or prevention system, may be located in the recess 580 to extract bubbles or prevent or reduce the creation of bubbles. At least a portion of the surface of the recess 580 and/or a surface of the system may be coated by the coating. This may enable improved control of the liquid and suppression and control of bubbles.

The coating may be applied to a sticker. The sticker may in turn be applied to a specific surface so the surface exhibits the properties of the coating. This is desirable where such a surface is a surface to which the coating may not otherwise be easily applied directly or easily. Such a location may be any one of the locations described previously as having a coating.

Although the coating has been described primarily in relation to a lithographic apparatus, it should be understood that the coating described herein may have other applications, for instance in a metrology apparatus. For example, the coating may have application in a metrology apparatus used to replicate the environment of an immersion system.

It will be appreciated that the above description in certain cases makes reference to materials or coatings being lyophobic or lyophilic. These terms may be used with reference to any type of liquid. Where water is present, for example, as the immersion liquid, the terms hydrophobic and hydrophilic may be used. Unless specified otherwise, lyophobic means a receding contact angle of greater than 90°, desirably greater than 100, 120, 130 or 140°. The contact angle in one embodiment is less than 180°. Unless stated otherwise lyophilic means a receding contact angle of less than 90°, desirably less than 80°, less than 70°, less than 60° or less than 50°. In one embodiment the contact angle is more than 0°, desirably more than 10°. These angles may be measured at room temperature (20° C.) and atmospheric pressure Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning structure defines the pattern created on a substrate. The topography of the patterning structure may be pressed into a layer of resist supplied to the substrate whereupon the resist is cured by applying electromagnetic radiation, heat, pressure or a combination thereof. The patterning structure is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams. The term "lens", where the context allows, may refer to any one or combination of various types of optical components, including refractive, reflective, magnetic, electromagnetic and electrostatic optical components.

One or more embodiments of the invention may be applied to any immersion lithography apparatus, in particular, but not exclusively, those types mentioned above and whether the immersion liquid is provided in the form of a bath to submerse a substrate or only on a localized surface area of the substrate and/or substrate table, or is unconfined. In an unconfined arrangement, the immersion liquid may flow over the surface of the substrate and/or substrate table. Substantially the entire uncovered surface of the substrate table and/or substrate is wetted. In such an unconfined immersion system, the liquid confinement structure may not confine the immersion liquid. In an embodiment, often referred to as 'All-Wet', substantially the entire substrate table and substrate is covered with a thin film of immersion liquid, at least during exposure. The liquid confinement structure may provide a proportion of immersion liquid confinement, but not substantially complete confinement of the immersion liquid. A liquid supply system, including or such as a liquid confinement structure, as contemplated herein should be broadly construed.

In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements, such as a controller, to control the position, quantity, quality, shape, flow rate or any other feature of the liquid. The one or more controlling elements can be provided to control the apparatus or one or more components of the apparatus.

While specific embodiments of the invention have been described above, it will be appreciated that the invention may be practiced otherwise than as described. For example, an embodiment of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

EXAMPLES

DUV resistance tests were performed using a Cymer ELS-6610A ArF laser. The laser had a wavelength of 193 nm, power of 10 W and frequency (repetition rate) of 2 kHz. Full width halve max was 0.35 pm and pulse duration was >25 ns. A sample received on the surface a DUV dose of about 1.28 mJ/cm$^2$/pulse.

In an experiment, DUV radiation was redirected by a $CaF_2$ mirror and entered the cell where it interacted with a sample submerged in water. The experimental cell was made of stainless steel 316L and had an inlet and outlet for water supply. It can be closed with a lid made of stainless steel with an incorporated quartz window in the middle. A rubber ring was used to provide a better contact between the lid and the cell.

DUV resistance tests were performed as follows:
1) Two Si wafer samples were prepared. The first had a SiOxCyHz coating (500 nm) while the second had a SiOxCyFz coating (1.2 μm). Both coatings were applied by PECVD. To act as a reference, a Si wafer sample was also prepared with a Teflon-AF coating.
2) The coatings were then exposed to a total DUV dose of 60, 500 and then 1000 J/cm$^2$ (0.5% of the machine life time) in both stagnant and running (1 L/min) water.
3) The resistance of the coatings to DUV radiation was then determined by measurement of the receding contact angle (RCA).

The results obtained for the SiOxCyHz, SiOxCyFz and Teflon-AF coatings are shown in FIG. 8. FIG. 8 is a graph comparing coatings with different chemical compositions.

As can be seen from FIG. 8, all three coatings show similar initial RCAs. The RCA for the Teflon coating decreases very rapidly showing this coating has a short lifetime. For the SiOxCyHz and SiOxCyFz coatings, initially the SiOxCyFz coating has a slightly lower value of the RCA than that for SiOxCyHz. However, after exposure of the coating to a large radiation dose the difference between two coatings becomes more pronounced. The RCA of the SiOxCyFz coating seems to saturate as the number of pulses increases; whereas the RCA of the SiOxCyHz coating continues to decrease. The saturation behavior of the SiOxCyFz coating is thought to be related to a combination of the effects of coating degradation with the change in roughness.

Figure 9:
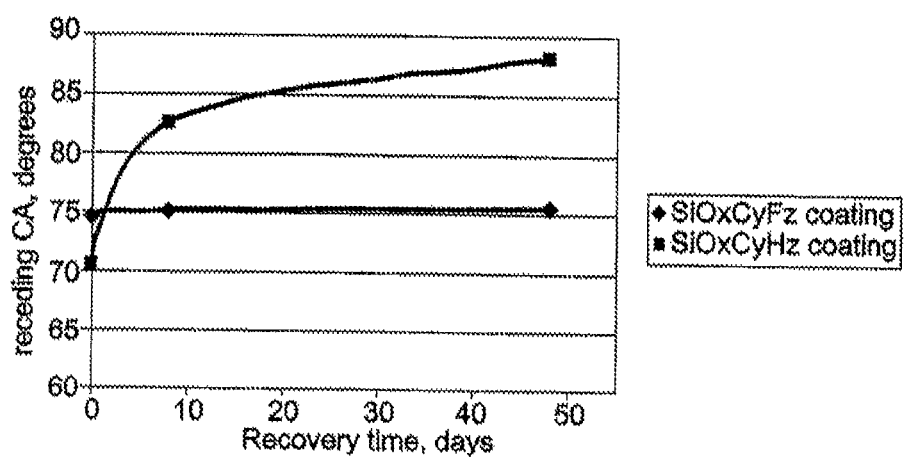
FIG. 9 depicts the recovery in receding contact angle over time shown by SiOxCyFz and SiOxCyHz coated samples that have been subjected to DUV radiation of 60 $J/cm^2$.

After the samples which contained the SiOxCyHz, SiOxCyFz coating had been exposed to a total DUV dose of 60 J/cm$^2$ in water running at a rate of 1 L/min, the RCAs of the samples were measured over time. The results are shown in FIG. 9. FIG. 9 shows the recovery effect in contact angle over time for coatings with different chemical compositions. As can be seen from the results presented in the graph, a significant recovery in the RCA is shown by the sample with the SiOxCyFz coating.

XPS analysis was performed in order to study chemical modification of the SiOxCyFz coating during DUV exposure. XPS results are presented in the following table. Measurements were performed on Si wafer samples coated with SiOxCyFz. SiOxCyFz-ref was a sample which had not been exposed to DUV radiation whereas SiOxCyFz-treated was exposed to DUV in running water (1 L/min). This was performed as discussed above using a Cymer ELS-6610A ArF laser and the sample exposed to a UV dose of 1000 J/cm$^2$. The silicon 2p—(Si 2p), oxygen 1s—(O 1s), carbon 1s—(C 1s) and fluorine 1s—(F 1s) peaks were measured and the results are given in the Table below.

Apparent concentrations (at %) as derived from narrow-scan measurements.

| Sample | Angle of measurement | C 1s $C_{283\,eV}$ | C 1s $C_{291\,eV}$ | F 1s | O 1s | Si 2p |
|---|---|---|---|---|---|---|
| SiOxCyFz-ref | 45° | 39.5 | 2.2 | 16.6 | 22.7 | 19.0 |
| SiOxCyFz-ref | 10° | 39.9 | 0.5 | 18.1 | 22.8 | 18.7 |
| | Ratio 10/45 | 1.0 | 0.2 | 1.1 | 1.0 | 1.0 |
| SiOxCyFz-treated | 45° | 19.5 | — | 4.6 | 49.5 | 26.5 |
| SiOxCyFz-treated | 10° | 18.6 | — | 6.1 | 48.6 | 26.8 |
| | Ratio 10/45 | 1.0 | — | 1.3 | 1.0 | 1.0 |

* Information depth 45° measurement = 7 nm, 10° measurement = 2 nm

The C 1s peak is present at a binding energy of 283.0 eV. This is ascribed to the carbide-like C (e.g. C in SiOCF layer). In the spectrum of SiOxCyFz-ref, a second C-peak is present at 291 eV. This could be due to C bound to F. The F 1s-peak is present around 686 eV. The Si 2p peak is present at 101.0 eV for SiOxCyFz-ref and at 101.6 eV for SiOxCyFz-treated. The reason for the peak position of the treated sample being slightly higher than that of the reference sample is thought to be due to the increase in the 0 content of the sample. The O 1s peak was at 531 eV.

From the results, an initial elemental composition for SiOxCyFz-ref can be calculated as Si:O=1:1.2; Si:C=1:2.1 and C:F=1:0.4. Exposure of the coating to DUV radiation in running water leads to an increase in oxygen and silicon concentration and a fall in a carbon and fluoride concentration which may be significant in magnitude. An elemental composition for SiOxCyFz-treated can be calculated as Si:O=1: 1.9; Si:C=1:0.7 and C:F=1:0.2.

The results obtained for the different depths in the sample shows that the reaction with the DUV radiation on the surface of the sample is less than in the depth of the sample where a higher fluorine concentration is measured. Since there is a greater concentration of fluorine at the surface, this can be associated with a high degree of nanoroughness in the sample.

XPS data was also generated to study chemical modification of the SiOxCyHz coating during DUV exposure. The experiments were carried out in an analogous way to that described above for the SiOxCyFz coating (thus, the treated sample was exposed to a UV dose of 1000 J/cm$^2$) and the results were as follows:

Apparent concentrations (at %) as derived from narrow-scan measurements,

| Sample | Angle of measurement | C 1s | O 1s | Si 2p |
|---|---|---|---|---|
| SiOxCyHz-ref | 10 | 44.1 | 29.2 | 26.8 |
| | 45 | 44.9 | 30.0 | 25.1 |
| SiOxCyHz-treated | 10 | 29.5 | 41.4 | 29.1 |
| | 45 | 33.6 | 40.0 | 26.4 |

Figure 10A:
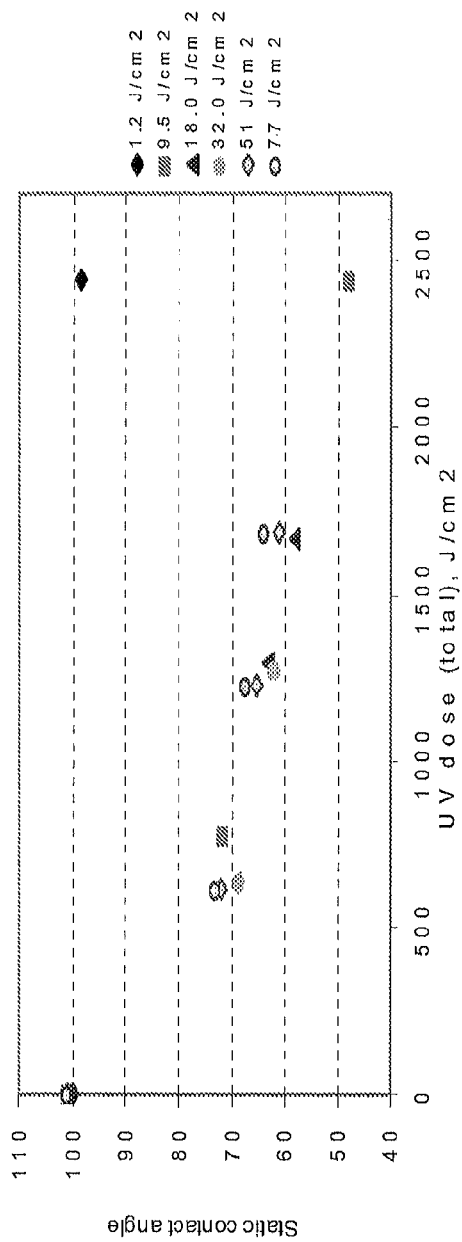
FIGS. 10a and 10b show the change in static contact angle shown by a SiOxCyHz coating when subjected to various DUV doses.
Figure 10B:
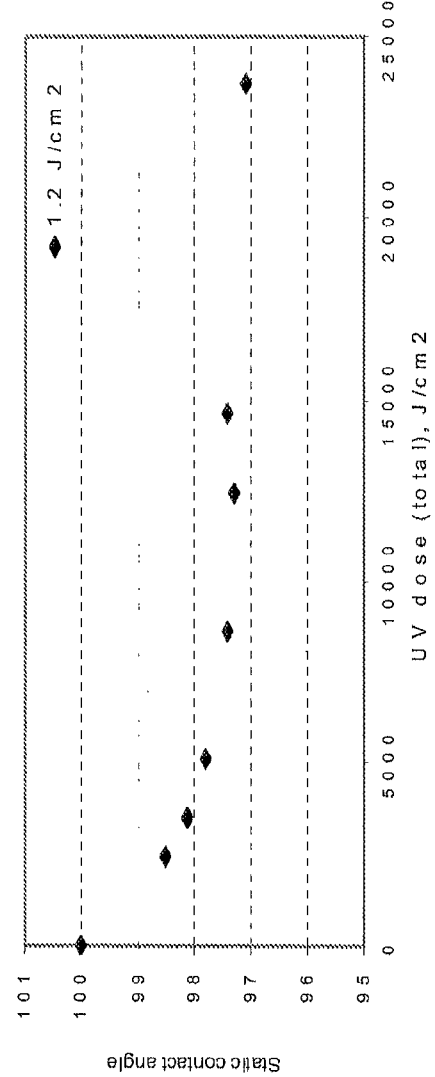

An experiment was also performed to determine how the static contact angle of the SiOxCyHz coating was affected by the strength of the DUV dose applied. The coating was exposed in standing water to various doses between 1 and 80 J/cm$^2$ and between exposures the coating was left for several minutes to dry. The results are shown in FIG. 10a. As can be seen from FIG. 10a, for doses higher than 9.5 J/cm$^2$ in a single exposure the coating degradation does not appear to depend on the dose in one exposure but instead depends on the total dose received. For doses of 1.2 J/cm$^2$/pulse a significant difference in behavior was observed in that the contact angle changed only slightly when the same total dose was reached. FIG. 10b shows an expanded view of the graph for a fixed dose of 1.2 J/m$^2$/pulse.

In an embodiment there is provided a lithographic apparatus comprising at least a portion of a surface of a part having a coating comprising the elements Si, O, F and, optionally, C and H. The apparatus may comprise a part having a coating comprising the elements Si, O, and F. The coating may consist essentially of the elements Si, O, F and, optionally, C and H. The coating may consist of the elements Si, O, F and, optionally, C and H. The recited elements may be comprised as a chemical compound present in the coating.

The F may be covalently bonded to C and/or the Si. The molar ratio between Si and F may be in the range of 1:0.1<Si: F<1:2. The ration Si:F may be in the range 1:0.2 to 1:0.4, desirably about 1:0.4. The coating may comprise a silicon oxide matrix with fluoro-based inclusions. The matrix may be a polysiloxane. The fluoro-based inclusion is a fluoro-dendrimer, fluoro-oligomer, or fluoro-silane.

In an embodiment the coating comprises the element H. In an embodiment the coating comprises the element C.

The O may be covalently bonded to the Si. The coating may be amorphous. The part may be a member selected from the group consisting of a sensor, a substrate table, a shutter member, a confinement structure, and an optical element.

The apparatus may be an immersion lithography apparatus. The apparatus may comprise a 193 nm radiation source.

In an embodiment, the molar ratio between Si and O is in the range of 1:1<Si:O<1:2. The ratio of Si:O may be about 1:1.2. The molar ratio between Si and C may be in the range of 1:0.1<Si:C<1:2.5. The ratio of Si:C may be in the range 1:0.7 to 1:2.1.

The coating may be a wet-chemically applied coating. The coating may be applied by chemical vapor deposition.

In an embodiment, there is provided a lithographic apparatus comprising at least a portion of a surface of a part having a coating comprising the elements Si, O, C and H.

In an embodiment, there is provided an article selected from the group consisting of a substrate table, an optical element, a shutter member, a sensor, a projection system, and a confinement structure, at least a portion of a surface of the article coated with a coating comprising the elements Si, O, F and, optionally, C and H. The coating may comprise the element H. The coating may comprise the element C.

In an embodiment, there is provided an article selected from the group consisting of a substrate table, an optical element, a shutter member, a sensor, a projection system, and a confinement structure, at least a portion of a surface of the article coated with a coating comprising the elements Si, O, C and H. In an embodiment the coating consists essentially of these elements. In an embodiment the coating consists of the elements. The article may be a substrate table. The article may be a sensor. The article may be an optical element. The article may be a lens, desirably a last lens element. The article may be a confinement structure. The article may be a shutter member. The article may be a projection system.

In an embodiment, there is provided a use of a coating as defined in a way mentioned above to protect at least a portion of a surface of a lithographic apparatus from the effects of DUV radiation.

The descriptions above are intended to be illustrative, not limiting. Thus, it will be apparent to one skilled in the art that modifications may be made to the invention as described without departing from the scope of the claims set out below.

What is claimed is:

1. An article of or for a lithographic apparatus selected from a group consisting of table, a shutter member, a sensor, a projection system housing, and a confinement structure, wherein at least a portion of a surface of the article is coated with a coating comprising a chemical compound comprising of the elements Si, O, and F.

2. The article of claim 1, wherein the coating further comprises the element H.

3. The article of claim 1, wherein the coating further comprises the element C.

4. The article of claim 3, wherein the molar ratio between elements Si and C is in the range of 1:0.1<Si:C<1:2.5.

5. The article of claim 1, wherein the coating further comprises the elements C and H.

6. The article of claim 1, wherein the coating comprises a silicon oxide matrix with fluoro-based inclusions.

7. The article of claim 1, wherein the coating consists essentially of the chemical compound of the elements Si, O, and F.

8. The article of claim 1, wherein the element F is covalently bonded to the element Si.

9. The article of claim 1, wherein the molar ratio between elements Si and F is in the range of 1:0.1<Si:F<1:2.

10. The article of claim 1, wherein the element O is covalently bonded to the element Si.

11. The article of claim 1, wherein the molar ratio between elements Si and O is in the range of 1:1<Si:O<1:2.

12. The article of claim 1, wherein the chemical compound comprises a silicon oxide matrix with fluoro-based inclusions.

13. The article of claim 12, wherein the matrix is a polysiloxane and/or the fluoro-based inclusion is a fluoro-dendrimer, fluoro-oligomer, or fluoro-silane.

14. The article of claim 1, wherein the coating is amorphous.

15. An article of or for a lithographic apparatus selected from a group consisting of a table, a shutter member, a sensor, a projection system housing, and a confinement structure, wherein at least a portion of a surface of the article is coated with a coating comprising a chemical compound comprising of the elements Si, O, C and H.

16. The article of claim 15, wherein the coating consists essentially of the chemical compound of the elements Si, O, C and H.

17. The article of claim 15, wherein the coating comprises Si:O/Si:C.

18. The article of claim 15, wherein the molar ratio between elements Si and O is in the range of 1:1<Si:O<1:6.

19. A lithographic apparatus comprising an article selected from a group consisting of a table, an optical element other than a patterning device configured to pattern a radiation beam, a shutter member, a sensor, a projection system, and a confinement structure, wherein at least a portion of a surface of the article is coated with a coating comprising an amorphous atomic-scale interpenetrating network comprising of the elements Si, O, and F and/or a coating comprising a chemical compound comprising of the elements Si, O, C and H.

20. Protecting at least a portion of a surface of a lithographic apparatus from the effects of DUV radiation by using a coating comprising an amorphous atomic-scale interpenetrating network comprising of the elements Si, O, and F and/or a coating comprising a chemical compound comprising of the elements Si, O, C and H, on the portion of the surface, the part of the apparatus being other than a radiation-sensitive substrate and other than a patterning device configured to pattern a radiation, the radiation-sensitive substrate being onto which the radiation is projected to form a pattern.

* * * * *